United States Patent
Kimoto

(10) Patent No.: US 7,514,943 B2
(45) Date of Patent: Apr. 7, 2009

(54) COORDINATE TRANSFORMING APPARATUS FOR ELECTRICAL SIGNAL CONNECTION

(76) Inventor: Gunsei Kimoto, 1-3-2-807, Daiba, Minato-ku, Tokyo (JP)

( * ) Notice: Subject to any disclaimer, the term of this patent is extended or adjusted under 35 U.S.C. 154(b) by 0 days.

(21) Appl. No.: 11/888,567

(22) Filed: Aug. 1, 2007

(65) Prior Publication Data
US 2008/0036449 A1 Feb. 14, 2008

(30) Foreign Application Priority Data
Aug. 8, 2006 (JP) ............................. 2006-240812

(51) Int. Cl.
*G01R 31/02* (2006.01)
*G01R 31/26* (2006.01)

(52) U.S. Cl. .................. 324/754; 324/149; 324/761; 324/765; 324/758

(58) Field of Classification Search .......... 324/754–765
See application file for complete search history.

(56) References Cited

U.S. PATENT DOCUMENTS 3,611,128 A * 10/1971 Nagata ...................... 324/72.5

6,271,674 B1 * 8/2001 Hasegawa et al. ........... 324/754
6,586,955 B2 * 7/2003 Fjelstad et al. .............. 324/754
2002/0135390 A1 * 9/2002 Fujii et al. .................. 324/761

FOREIGN PATENT DOCUMENTS

JP 07-318586 12/1995
JP 2003-075503 3/2003

* cited by examiner

*Primary Examiner*—Ha Tran T Nguyen
*Assistant Examiner*—Emily Y Chan
(74) *Attorney, Agent, or Firm*—Haynes and Boone, LLP

(57) ABSTRACT

Vertical contactors regularly arrayed over a film is brought into vertical contact with the end faces of wiring terminals formed at one end of a flexible flat cable, and signal lines from a narrowed-pitch contactor array are connected to a printed circuit board. For this purpose, there is to be realized a coordinate transforming apparatus for electrical signal connection including: a device that has probe input terminals and probe output terminals arrayed in narrow-pitch lines which come into contact with and establish continuity to a wafer pad and in which the probe output terminals are arrayed two-dimensionally in a wide pitch over a substantial plane; a y-directional wiring group in which the probe output terminals and transformation wiring input terminals cross each other to come into contact with and establish continuity among each other; and an x-directional wiring group that crosses and establishes continuity to the output terminals of the y-directional wiring group.

9 Claims, 14 Drawing Sheets

COORDINATE TRANSFORMING APPARATUS FOR ELECTRICAL SIGNAL CONNECTION

CROSS REFERENCE

This application claims priority to Japanese patent application number 2006-240812, filed Aug. 8, 2006, the disclosure of which is incorporated herein by reference.

BACKGROUND OF THE INVENTION

1. Field of the Invention

The present invention relates to a coordinate transforming apparatus for electrical signal connection for use in probe cards and the like, and more particularly to a coordinate transforming apparatus for electrical signal connection intended for effective wiring from contactors to over a probe card substrate.

2. Description of the Prior Art

In the manufacturing process of an electronic device such as an LSI, a probe card is used for circuit inspection of plural semiconductor chips formed over a semiconductor wafer. The present inventors have proposed various probe cards using vertical probes. With any such probe card, by bringing a vertical probe into contact with plural circuit terminals (pads) arrayed on semiconductor chips intact in the wafer state, it is possible to measure the electrical continuity of the semiconductor chips collectively. Such conventional probe cards include the ones disclosed in JP-A-318586/1995 and JP-A-75503/2003.

Hereupon, the probe card disclosed in JP-A-318586/1995 will be shown in FIG. 14 as an example of the prior art. In this probe card, plural probes 3 are soldered onto a probe land section 7 formed as part of printed wiring over a printed circuit board 6. The connection of the probe land section 7 extends to a wire fitting section 8a. On the other hand, terminal pins 2 are connected to a wire fitting section 8b by printed wiring. This printed circuit board 1, including the planted terminal pins 2, is designed in common for all the types of semiconductor elements, and differs with the type only in the arrangement of the probes 3 and in the connection between the wire fitting sections 8a and 8b. If this connection between the wire fitting sections 8a and 8b is accomplished with a printed circuit board, the printed circuit board 1 will have to be designed differently for each type of semiconductor element and therefore become very expensive. Therefore, connection of this section is accomplished with a polyvinyl chloride wire 5a or, where noise in particular poses a problem, a shielded wire 5b differently for each type of semiconductor element. To add, though the foregoing description may give an impression that wiring of a printed circuit board is done over only one face of the board, the increase in the number of pins has necessitated the use of wiring over both faces or of multi-layered wiring.

A probe card may include a mother board made up of a printed circuit board of a common design irrespective of the type of semiconductor element, terminal pins to be connected to a tester, probes arranged according to the type of semiconductor element, and a child board which connects the probes with the terminal pins, and is made up of a printed circuit board designed according to the type of semiconductor element (JP-A-116312/1994).

Conventionally, wiring from the child board to the mother board in such an arrangement is accomplished with a multi-layered substrate connecting narrow-pitched contactor wiring to wide-pitched wiring.

However, any conventional probe card has a disadvantage that, if polyvinyl chloride wiring is used, will take in measurement noise generated by the operation of the semiconductor element to be measured. Or if shielded wiring hardly letting in measurement noise, the wire diameter will increase, and therefore the increased wiring volume and the limitation of the area that can accommodate wiring may forbid coaxial wiring. Furthermore, an increase in the number of measuring pins would invite an increase in man-hours spent on wiring and defects in wires and soldering might make leak currents more likely to occur, even inviting disconnection. There is a disadvantage that, even if a child board made up of a printed circuit board designed according to the type of semiconductor element is used, the presence of many pins would require a multi-layered substrate.

SUMMARY OF THE INVENTION

The present inventors have developed a device for connection, to a printed circuit board, of signal lines from a narrow-pitched contactor array characterized by vertical contacting of vertical contactors regularly arrayed over a film to the end faces of wiring terminals formed at one end of a flexible flat cable.

In order to address the problems with conventional probe cards noted above, a coordinate transforming apparatus according to the invention includes: a device that has probe input terminals and probe output terminals arrayed in narrow-pitch lines which come into contact with and establish continuity to a wafer pad and in which the probe output terminals are arrayed two-dimensionally in a wide pitch over a substantial plane; a y-directional wiring group in which the probe output terminals and transformation wiring input terminals cross each other to come into contact with and establish continuity among each other; and an x-directional wiring group that crosses and establishes continuity to the output terminals of the y-directional wiring group. This arrangement makes it possible for probe output terminal signals which have become coordinate signals dispersed in the x-direction in a narrow pitch in the y-direction by plural contactors arranged to match a pad array in the y-direction, for instance, to be transformed into signal wiring dispersed in the y-direction by the y-directional wiring group at the y-directional wiring output terminals, and further to transfer the coordinates of the output terminals of x-directional wiring group by the x-directional wiring group to required positions. Therefore, it provides the advantage of allowing connection of coordinate-transformed signal lines over a narrow-pitch pad to an inexpensive printed wiring board compatible only with sparse signal wiring.

Thus, it has the advantage of allowing connection of coordinate-transformed signal lines over a narrow-pitch pad on a wafer over to an inexpensive printed wiring board compatible only with sparse signal wiring. This means that wiring can be accomplished requiring neither soldering nor a multi-layered substrate and that a probe card substrate of a simple structure can be configured.

Therefore, transformation wiring according to the invention provides the advantage of allowing electrical connection of signals on a narrow-pitch line array over an inexpensive printed wiring board having sparse electrodes without involving the intervention of multi-layered substrate technology.

DETAILED DESCRIPTION OF THE PREFERRED EMBODIMENTS

Embodiment 1

Embodiment 1 of the present invention will be described in detail below with reference to FIG. 1 through FIG. 11. The invention is in no way limited by this embodiment, though.

Figure 1:
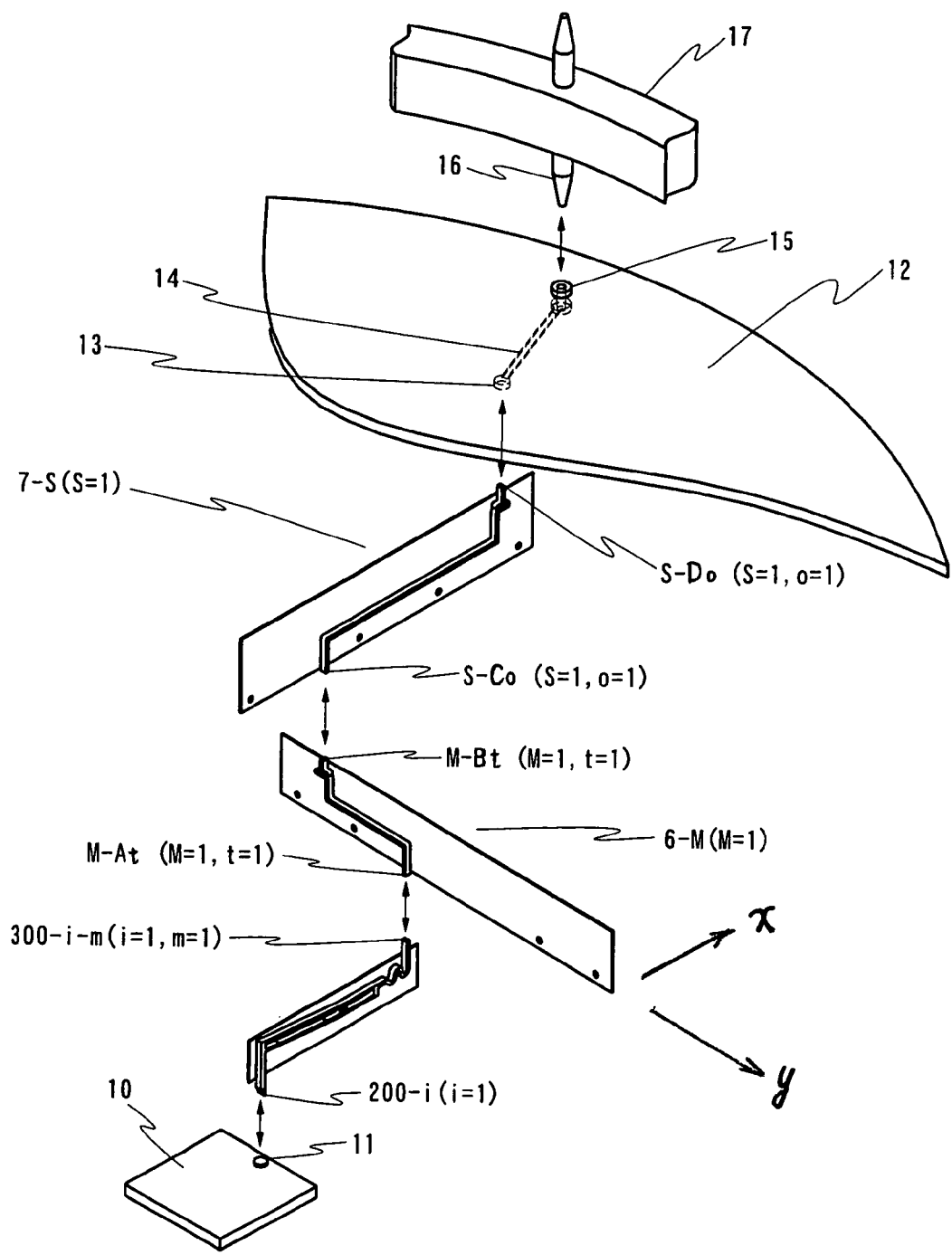
FIG. 1 shows a perspective view of part of the configuration of Embodiment 1 of the present invention.
Figure 2:
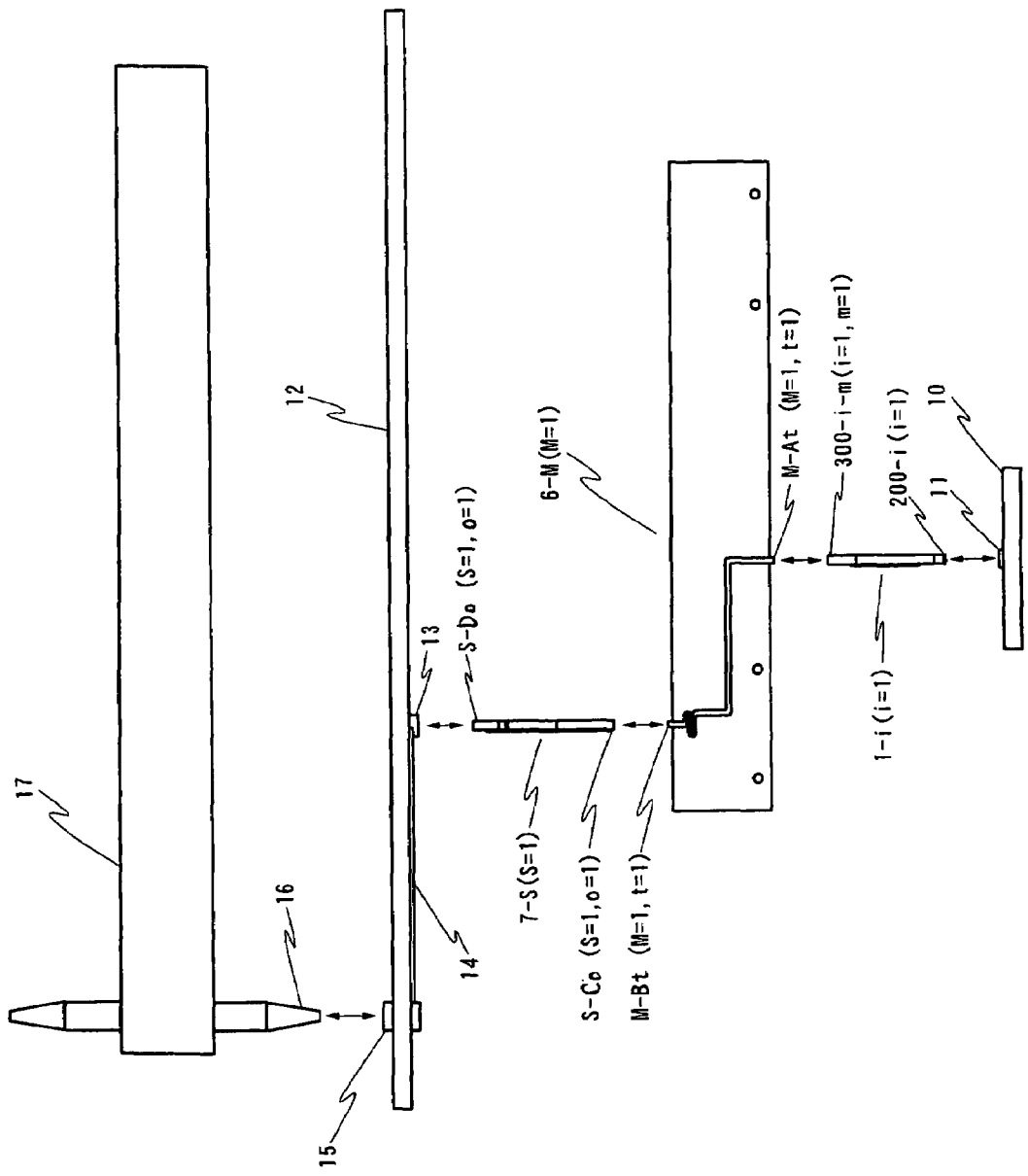
FIG. 2 shows a front view of FIG. 1.

FIG. 1 shows a perspective view of part of the configuration of Embodiment 1 of the invention, and FIG. 2 shows a front view of FIG. 1. In FIG. 1 and FIG. 2, reference numeral 1-$i$ denotes contactors; 200-$i$ denotes probe input terminals; 300-$i$-$m$ denotes a probe output terminal; 6-M denotes a y-directional wiring; M-At denotes a y-directional wiring input terminal; M-Bt denotes a y-directional wiring output terminal; 7 denotes x-directional wiring; S-Co denotes an x-directional wiring input terminal; S-Do denotes an x-directional wiring output terminal; 10 denotes a chip; 11 denotes a pad; 12 denotes a printed circuit board; 13 denotes a printed circuit board input terminal; 14 denotes printed circuit board wiring; 15 denotes a printed circuit board output terminal; 16 denotes a pogo pin; and 17 denotes a pogo pin ring. The x-direction and the y-direction are the directions indicated respectively by x-y coordinates in FIG. 1.

The pad 11 is placed over the chip 10, which is arranged over a wafer. The contactor 1 has the probe input terminal 200-$i$ and the probe output terminal 300-$i$-$m$ as electrical connection terminals. The contactor 1 will be described in further detail with reference to FIG. 3. The y-directional wiring 6 has the y-directional wiring input terminal M-At and the y-directional wiring output terminal M-Bt as electrical connection terminals. The y-directional wiring 6 will be described in further detail with reference to FIG. 6. The x-directional wiring 7 has the x-directional wiring input terminal S-Co and the x-directional wiring output terminal S-Do as electrical connection terminals. The x-directional wiring 7 will be described in further detail with reference to FIG. 9. The printed circuit board 12 electrically connects the printed circuit board input terminal 13 with the printed circuit board output terminal 15 by way of the printed circuit board wiring 14. The printed circuit board input terminal 13 is formed over the surface of the printed circuit board 12 as illustrated in FIG. 1. The pogo pin 16 is supported by the pogo pin ring 17.

In the assembled state, the probe output terminal 300-$i$-$m$ and the y-directional wiring input terminal M-At, the y-directional wiring output terminal M-Bt and the x-directional wiring input terminal S-Co, the x-directional wiring output terminal S-Do and the printed circuit board input terminal 13, and the printed circuit board output terminal 15 and the pogo pin 16 are respectively pressure-welded to each other to establish continuity. At the time of inspection, the pad 11 is moved in the z-direction to bring the probe input terminal 200-$i$ into contact with the pad 11 to establish continuity between them.

Although FIG. 1 and FIG. 2 are partial drawings showing only one contactor 1-1 to simplify illustration, in the actual configuration plural contactors 1 are stacked in the y-direction, plural y-directional wiring 6 layers are stacked in the x-direction, and plural x-directional wiring 7 layers are stacked in the y-direction. Similarly to the contactors 1, plural pads 11 are stacked in the y-direction.

Therefore, at the time of inspection, the moving of the pad 11 in the z-direction to bring the probe input terminal 200-$i$ and the pad 11 into contact with each other establishes continuity between the pad 11 and the probe input terminal 200-$i$, between the probe output terminal 300-$i$-$m$ and the y-directional wiring input terminal M-At, between the y-directional wiring output terminal M-Bt and the x-directional wiring input terminal S-Co, and between the x-directional wiring output terminal S-Do and the printed circuit board input terminal 13, and between the printed circuit board output terminal 15 and the pogo pin 16, with the result that electrical continuity is established between the pad 11 and the pogo pin 16. Therefore, electrical continuity is established to an external tester (not shown) via the pogo pin 16.

Regarding the above-described configuration of the invention in its first embodiment, its operations and effects will be described below, wherein 6-M denotes y-directional wiring. The y-directional wiring 6 includes a resin film 60, the y-directional transformation wiring ft (t=1 to 6) and a fixed section 67. The y-directional transformation wiring ft includes a y-directional transformation wiring input terminal At, a y-directional transformation wiring output terminal Bt, y-directional transformation wiring ft and a spring section kt. M is a reference sign assigned to a unit of y-directional wiring 6 formed on a sheet. For instance, 6-1 denotes the first sheet of y-directional wiring. Further, 1-At (t=3) denotes the third y-directional transformation wiring input terminal formed in the first sheet of y-directional wiring. Thus, the first numeral is the sheet number and the hyphen is followed by the item name (A) and the arrangement number (t) in the wiring network. The y-directional transformation wiring ft, the y-directional transformation wiring output terminal Bt, the y-directional transformation wiring ft and the spring section kt are expressions in the same way.

Reference sign 7-S (S=1 to 6) denotes an x-directional wiring subassembly, in which 7 denotes x-directional wiring. The x-directional wiring 7 includes a resin film 70, x-directional wiring go (o=1 to 6) and a fixed section 77. The x-directional transformation wiring go includes an x-directional wiring input terminal Co, x-directional transformation wiring output terminal Do, x-directional transformation wiring go and a spring section ho. S is a reference sign assigned to x-directional wiring 7 formed on a sheet. For instance, 7-1 denotes the first sheet of x-directional wiring. Further, 1-Co (o=3) denotes the third x-directional transformation wiring input terminal formed in the first sheet of x-directional wiring. Thus, the first numeral is the sheet number and the hyphen is followed by the item name (A) and the arrangement number (o) in the wiring network. The x-directional transformation wiring go, the x-directional transformation wiring output terminal Do, the x-directional transformation wiring go and the spring section ho are expressions in the same way.

Embodiment 2 is a version of Embodiment 1 having a structure which allows the wiring of the input terminals and the output terminals of the y-directional wiring and the wiring of the input terminals and the output terminals of the x-directional wiring to be freely selected at the design stage. This selectability enables wiring, in whatever sequence the probe input terminals $200\text{-}i$ may be arrayed, to be arranged in desired positions of the x-directional transformation wiring output terminals.

Figure 3:
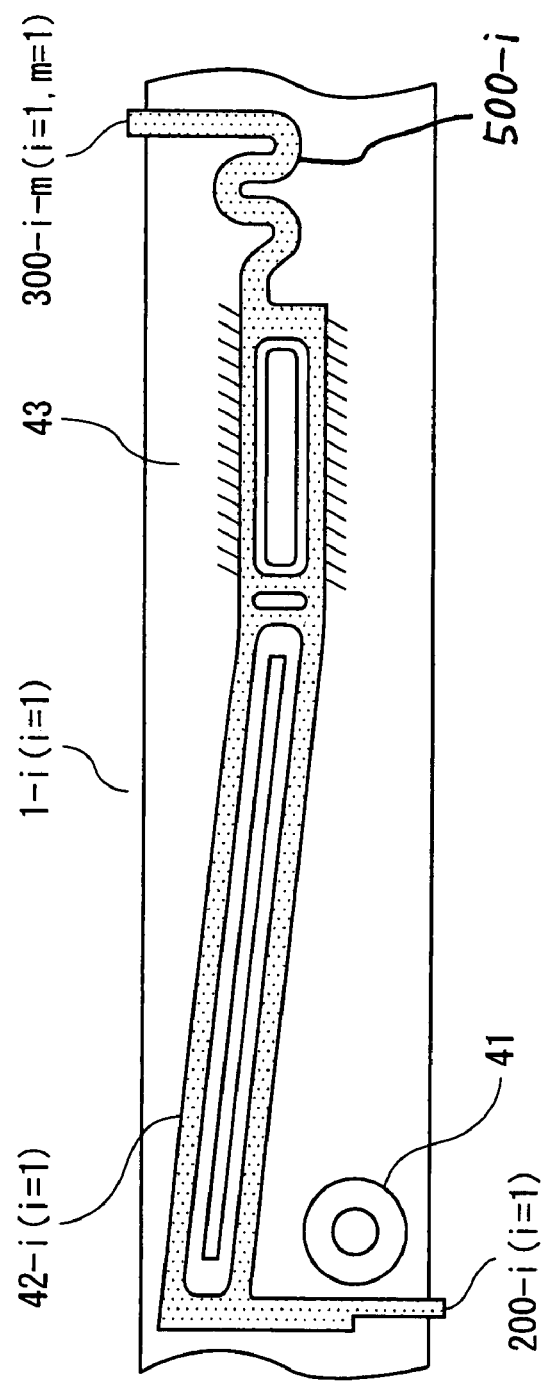
FIG. 3 shows a front view of a contactor 1 in Embodiment 1 of the invention.
Figure 4:
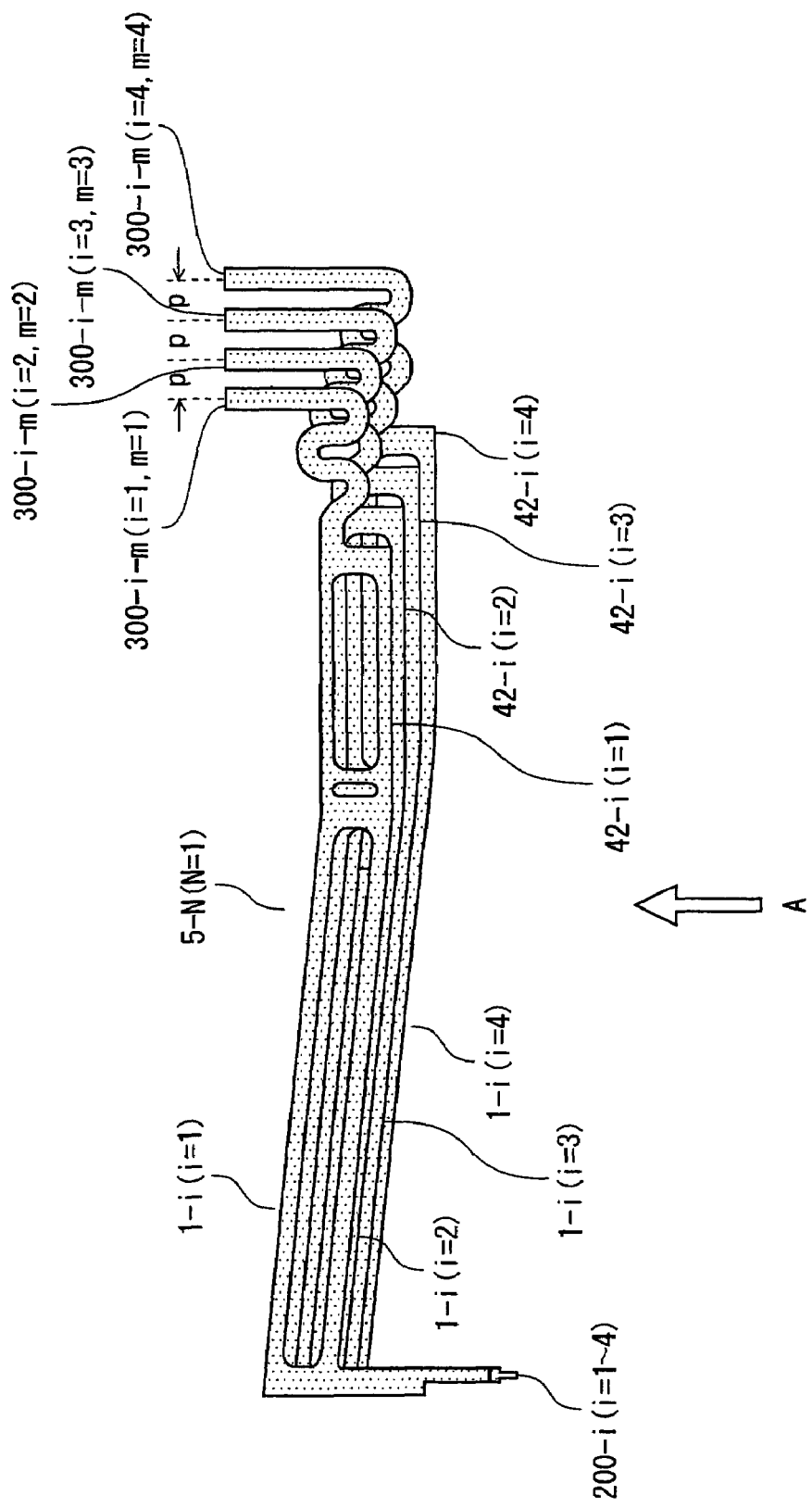
FIG. 4 shows a front view of a contactor assembly 5 in Embodiment 1 of the invention.

FIG. 3 shows a front view of the contactor 1 in Embodiment 1 of the invention. FIG. 4 shows a front view of only the probe section in a contactor assembly 5 in which plural contactors 1 are arrayed in a direction normal to the paper surface (hereinafter to as the y-direction) in a desired pitch.

Referring to FIG. 3, reference sign $1\text{-}i$ denotes contactors. A contactor $1\text{-}i$ includes a resin film 43, a fixed section 41 and a probe $42\text{-}i$. The probe $42\text{-}i$ includes the probe input terminal $200\text{-}i$, the probe output terminal $300\text{-}i\text{-}m$, a deformed section $400\text{-}i$ and a spring section $500\text{-}i$.

In the contactor $1\text{-}i$, the fixed section 41 and the probe $42\text{-}i$ are fixed over the resin film 43 by adhesion. The resin film 43 is made of an insulative resin material (preferably polyimide for instance). The probe $42\text{-}i$ is made of a conductor (preferably beryllium copper for instance). The fixed section 41 is made of the same conductor as the probe $42\text{-}i$.

Electrical signals inputted from the probe input terminal $200\text{-}i$ are outputted to the probe output terminal $300\text{-}i\text{-}m$ via the deformed section $400\text{-}i$ and the spring section $500\text{-}i$. The probe output terminals $300\text{-}i\text{-}m$ characteristically protrude in the z-direction farther than the upper side of the resin film 43 and, together with the springiness of the spring section $500\text{-}i$, ensure electrical connection with other electrical contacts. Therefore, electrical signals inputted from the probe input terminal $200\text{-}i$ are securely communicated to other electrical contacts via the probe output terminal $300\text{-}i\text{-}m$.

The fixed section 41 has a hole into which a rod (round rod, not shown) is pressed in. The pressing-in of the rod into this hole enables the contactors 1 to be stacked in the desired pitch and fixed.

In FIG. 4, reference sign $1\text{-}i$ ($i=1$ to 12) denotes contactors. The contactors $1\text{-}i$ have the same functions as those of the contactors 1 described with reference to FIG. 3. Reference sign $42\text{-}i$ denotes probes; $200\text{-}i$ denotes probe input terminals; and $300\text{-}i\text{-}m$ denotes probe output terminals. The tips of the probe input terminals $200\text{-}i$ of the contactors $1\text{-}i$ stacked in the desired pitch in the y-direction are formed at the same height in the z-direction. The tips of the probe output terminals $300\text{-}i\text{-}m$ are also formed at the same height in the z-direction. Further, the probe output terminals $300\text{-}i\text{-}m$ have phase differences in a pitch p in the x-direction.

Although this embodiment of the invention has been described with reference to the contactor and the contactor assembly shown in FIG. 3 for the sake of convenience, the invention is not limited to these system and structure of contactor, and any contactor assembly in which the probe output terminals have phase differences in the pitch p in the x-direction can be applied to the invention.

In the configuration shown in FIG. 4, the contactor assembly 5 actually has many more contactors $1\text{-}1, 1\text{-}2 \ldots 1\text{-}12$, but only the contactors $1\text{-}1$ through $1\text{-}4$ are shown therein, and the illustration of other contactors is dispensed with.

Figure 5:
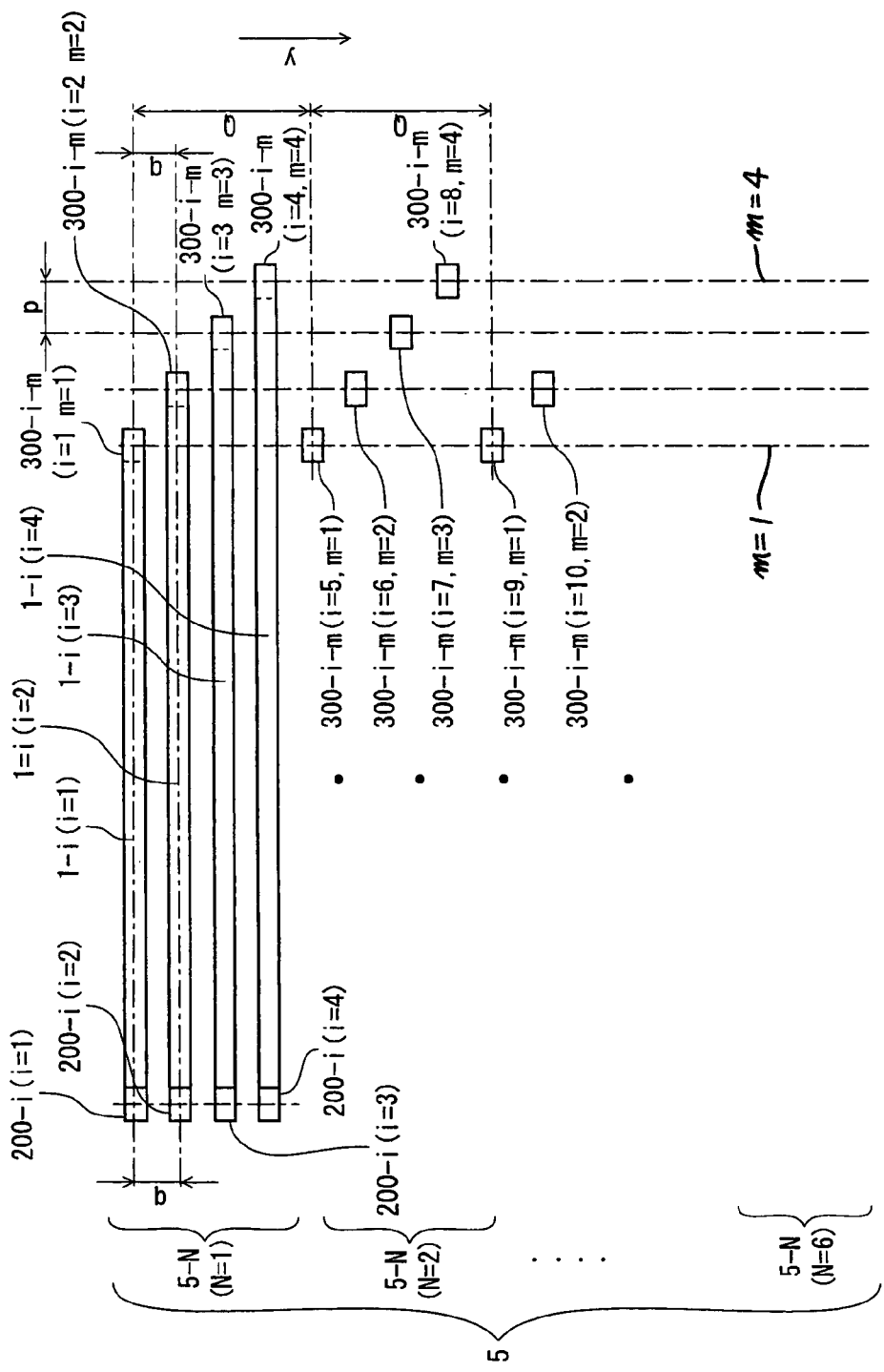
FIG. 5 shows a plan of the contactor assembly 5 in Embodiment 1 of the invention as viewed in the direction of arrow A in FIG. 4.

FIG. 5 shows a plan of the contactor assembly 5 as viewed in the direction of arrow A in FIG. 4. As shown in FIG. 5, the contactor assembly 5 includes contactor subassemblies $5\text{-}N$ ($N=1$ to 6). In the reference signs, N represents the arrangement number of contactor subassemblies and i, that of contactors. The contactors $1\text{-}i$ ($i=1$ to 24) are stacked in a pitch q in the y-direction, and $i=1$ to 4 matches $N=1$ of the subassemblies $5\text{-}N$, $i=5$ to 8 to $N=2$, $i=9$ to 12 to $N=3$, $i=13$ to 16 to $N=4$, $i=17$ to 20 to $N=5$ and $i=21$ to 24 to $N=6$. Thus there are six groups in this Embodiment 1. The probes $1\text{-}i\text{-}m$ match the arrangement numbers of N, wherein i is the serial number for all the contactors and m, the arrangement numbers in each group. In FIG. 5, $i=1$ to 4 are shown out of $i=1$ to 24 and $m=1$ to 4, and the others are dispensed with. The probe input terminals $200\text{-}i$ are arrayed in a straight line in the x-direction. It is indicated that, when $i=n=1$ ($i=1$ to 24, $m=1$ to 4) in the x-directional position of the probe output terminals $300\text{-}i\text{-}m$, (n, n+4, n+8, n+12, n+16, n+20) are on the same straight line, (n+2, n+6, n+10, n+14, n+18, n+22) are on the same straight line and (n+3, n+7, n+11, n+15, n+19, n+23) are on the same straight line. FIG. 5 shows the sequence until $i=10$.

Figure 6:
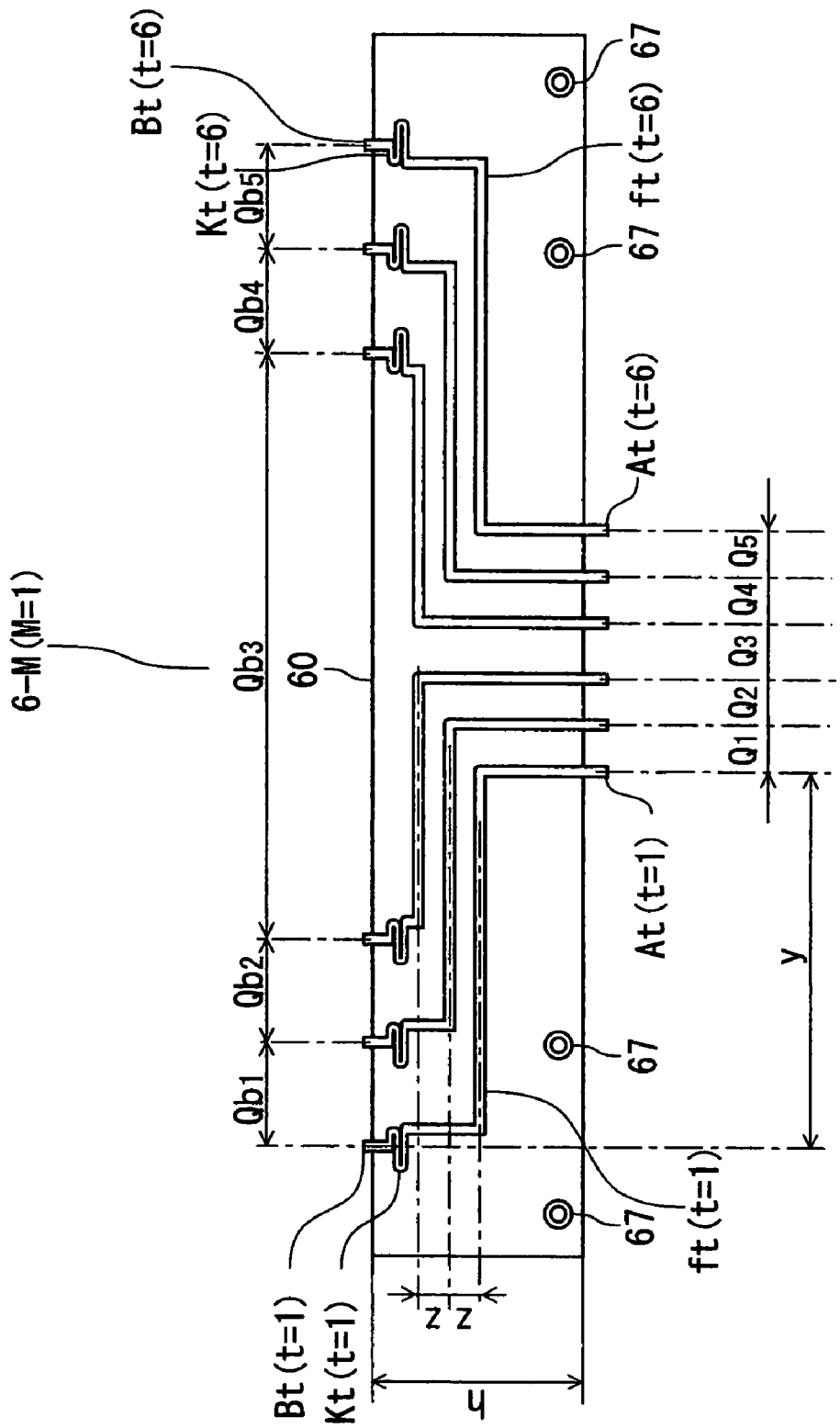
FIG. 6 shows a front view of one unit of y-directional wiring in Embodiment 1 of the invention.

FIG. 6 shows a front view of one unit of y-directional wiring. In FIG. 6, $6\text{-}M$ denotes y-directional wiring. The y-directional wiring 6 includes a resin film 60, the y-directional transformation wiring ft ($t=1$ to 6) and the fixed section 67. The y-directional transformation wiring ft includes the y-directional transformation wiring input terminal At, the y-directional transformation wiring output terminal Bt, the y-directional transformation wiring ft and the spring section kt. M is a reference sign assigned to the y-directional wiring 6 formed on a sheet. For instance, $6\text{-}1$ denotes the first sheet of y-directional wiring, and $1\text{-}At$ ($t=3$), the third y-directional transformation wiring input terminal formed in the first sheet of y-directional wiring. Thus, the first numeral is the sheet number and the hyphen is followed by the item name (A) and the arrangement number (t) in the wiring network. The t-directional transformation wiring ft, the y-directional transformation wiring output terminal Bt, the y-directional transformation wiring ft and the spring section kt are expressions in the same way.

In the y-directional wiring 6, the y-directional transformation wiring ft and the fixed section 67 are fixed over the resin film 60 by adhesion. The resin film 60 is made of an insulative resin material (preferably polyimide for instance). The y-directional transformation wiring ft is made of a conductor (preferably beryllium copper for instance). The fixed section 67 is made of the same conductor as the y-directional transformation wiring ft.

The y-directional transformation wiring input terminals At are formed at the same height in the z-direction and arranged at intervals of a pitch Q in the y-direction. This pitch Q has the same meaning as the pitch q described with reference to FIG. 5. Further, the y-directional transformation wiring input terminal At ($t=1$) through the y-directional transformation wiring input terminal At ($t=6$) characteristically protrude in the z-direction farther than the lower side of the resin film 60 and ensure electrical connection with other electrical contacts. The y-directional transformation wiring output terminals Bt are formed at the same height in the z-direction, and the y-directional transformation wiring output terminals Bt are arranged at intervals in a pitch Qb in the y-direction. The spring section kt, having springiness, gives rise to a contacting force with other electrical contacts to ensure electrical connection with them.

The y-directional transformation wiring ft is present between the spring section kt and the y-directional transformation wiring output terminal Bt. When the y-directional transformation wiring ft is developed in the horizontal direction, it is given a phase difference z in the z-direction, with the result that individual wiring units can be arranged, without becoming entangled with each other, at a desired distance y apart, and the y-directional transformation wiring output terminals Bt can be arranged at the pitch Qb sufficiently wider than the pitch Q in which the y-directional transformation wiring input terminals At are arranged.

In this case, it is possible to reduce the overall height h of the y-directional wiring 6 by dividing the units the y-directional transformation wiring ft to right and left and when they are developed in the horizontal direction as shown in FIG. 6 and thereby restraining the total number of phase differences in the z-direction. In this embodiment, division to right and left is practiced.

The fixed section 67 has a hole into which a rod (round rod, not shown) is pressed in. The pressing-in of the rod into this hole enables units of the y-directional wiring 6 to be stacked in the desired pitch and fixed.

Figure 7:
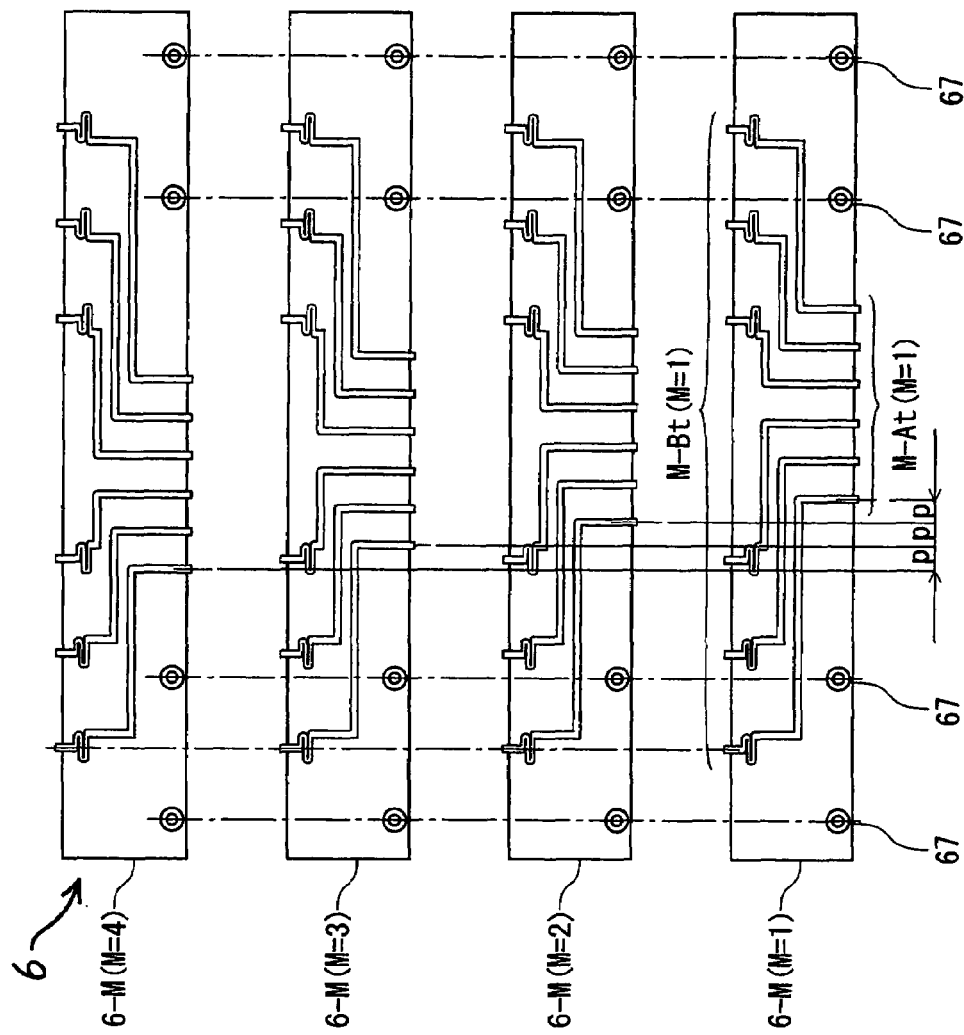
FIG. 7 shows an assembled plan of y-directional wiring in Embodiment 1 of the invention.

FIG. 7 shows an assembled plan of y-directional wiring. The y-directional wiring 6-M includes the y-directional wiring input terminals M-At (M=1 to 4; M means the same hereinafter), the y-directional transformation wiring output terminals M-Bt, y-directional transformation wiring M-ft and so forth. The fixed section 67 is the same and located in the same position as what was described with reference to the front view of one unit of y-directional wiring shown in FIG. 6, and the positions of the y-directional transformation wiring output terminals Bt also are the same. The respective positions of the y-directional transformation wiring input terminals M-At differ from those described with reference to the front view of one unit of y-directional wiring shown in FIG. 6, and the quantities of positional differences are represented by p.

Figure 8:
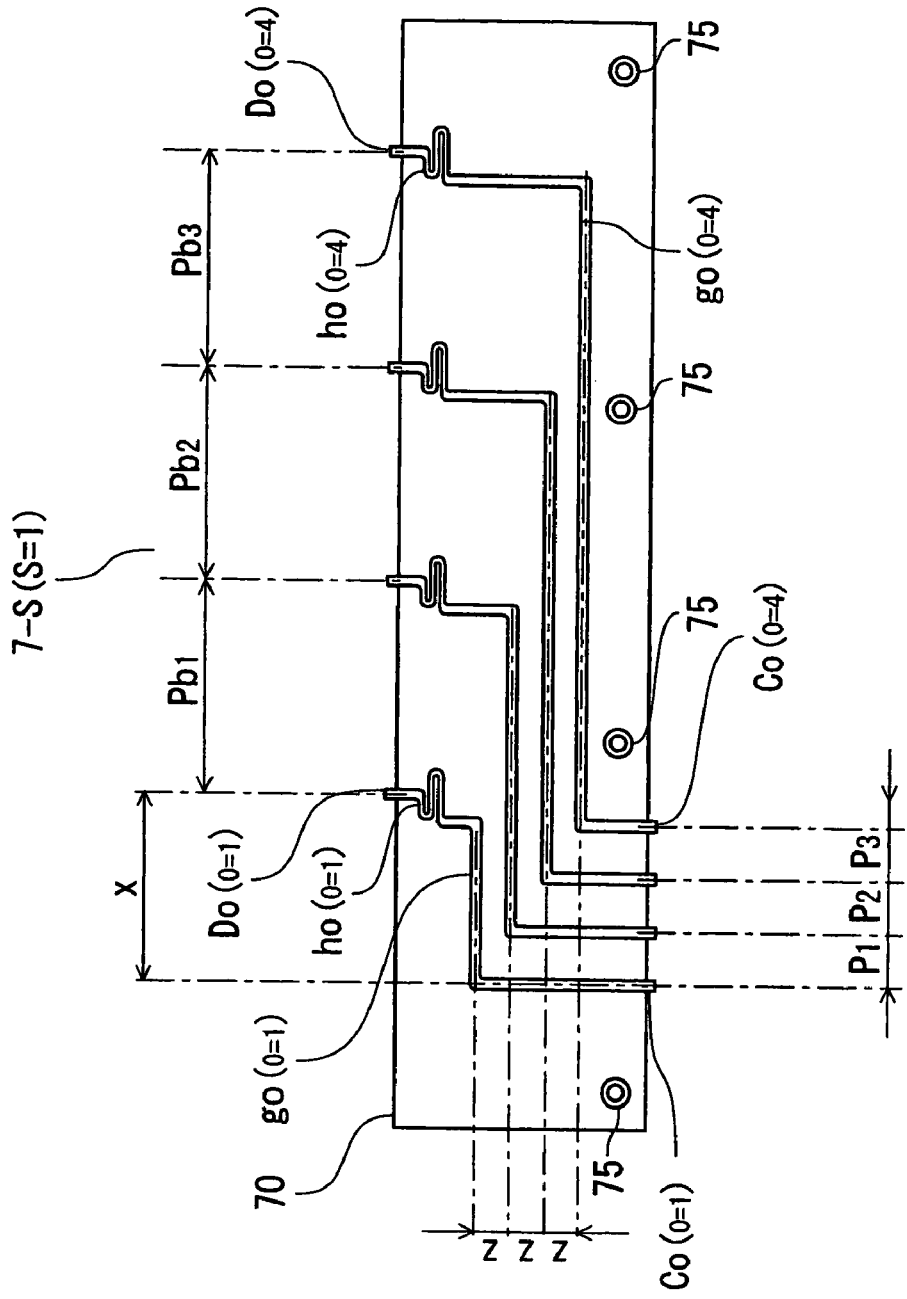
FIG. 8 shows a front view of one unit of x-directional wiring in Embodiment 1 of the invention.

FIG. 8 shows a front view of one unit of x-directional wiring, wherein 7-S (S=1 to 6) denotes x-directional wiring subassemblies and 7 denotes x-directional wiring. The x-directional wiring 7 includes the resin film 70, the x-directional transformation wiring go (o=1 to 6) and the fixed section 77. The x-directional transformation wiring go includes the x-directional transformation wiring input terminal Co, x-directional transformation wiring output terminal Do, the x-directional transformation wiring go and the spring section ho. S is a reference sign assigned to x-directional wiring 7 formed on a sheet. For instance, 7-1 denotes the first sheet of x-directional wiring. Further, 1-Co (o=3) denotes the third x-directional transformation wiring input terminal formed in the first sheet of x-directional wiring. Thus, the first numeral is the sheet number and the hyphen is followed by the item name (A) and the arrangement number (o) in the wiring network. The x-directional transformation wiring go, the x-directional transformation wiring output terminal Do, the x-directional transformation wiring go and the spring section ho are expressions in the same way.

The x-directional transformation wiring go is present between the spring section ho and the x-directional transformation wiring output terminal Do. When the x-directional transformation wiring go is developed in the horizontal direction, it is given a phase difference z in the z-direction, with the result that individual wiring units can be arranged, without becoming entangled with each other, at a desired distance x apart, and the x-directional transformation wiring output terminals Do can be arranged at the pitch Pb sufficiently wider than the pitch P in which the x-directional transformation wiring input terminals Co are arranged.

Figure 9:
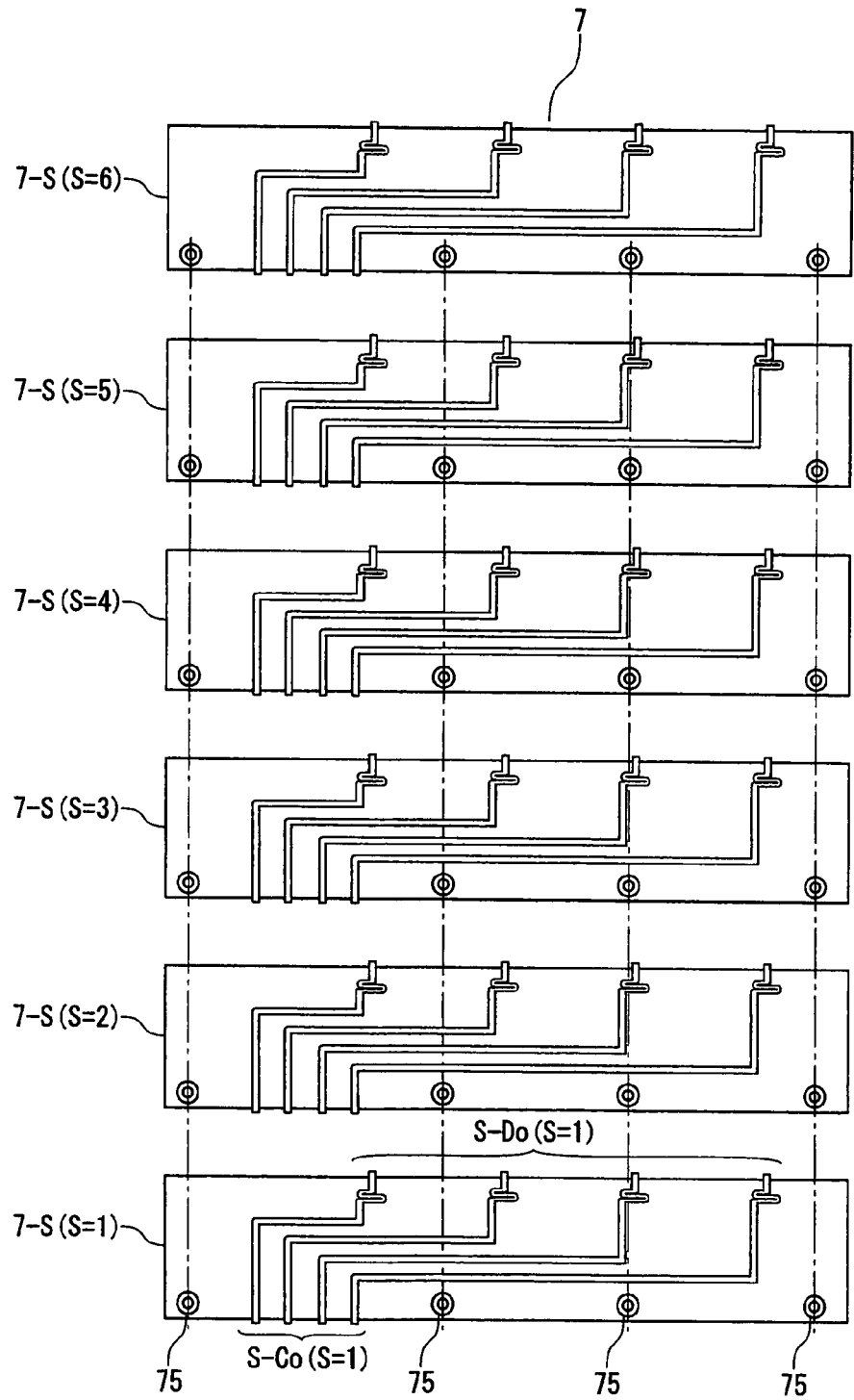
FIG. 9 shows an assembled plan of x-directional wiring in Embodiment 1 of the invention.

FIG. 9 shows an assembled plan of x-directional wiring. The x-directional wiring subassemblies 7-1 through 7-6 are the same. Thus, the positions of a fixed section 75, the x-directional transformation wiring input terminal Co and the x-directional transformation wiring output terminal Do are respectively the same as those of the elements described with reference to the front view of the one unit of x-directional wiring described with reference FIG. 8.

Figure 10:
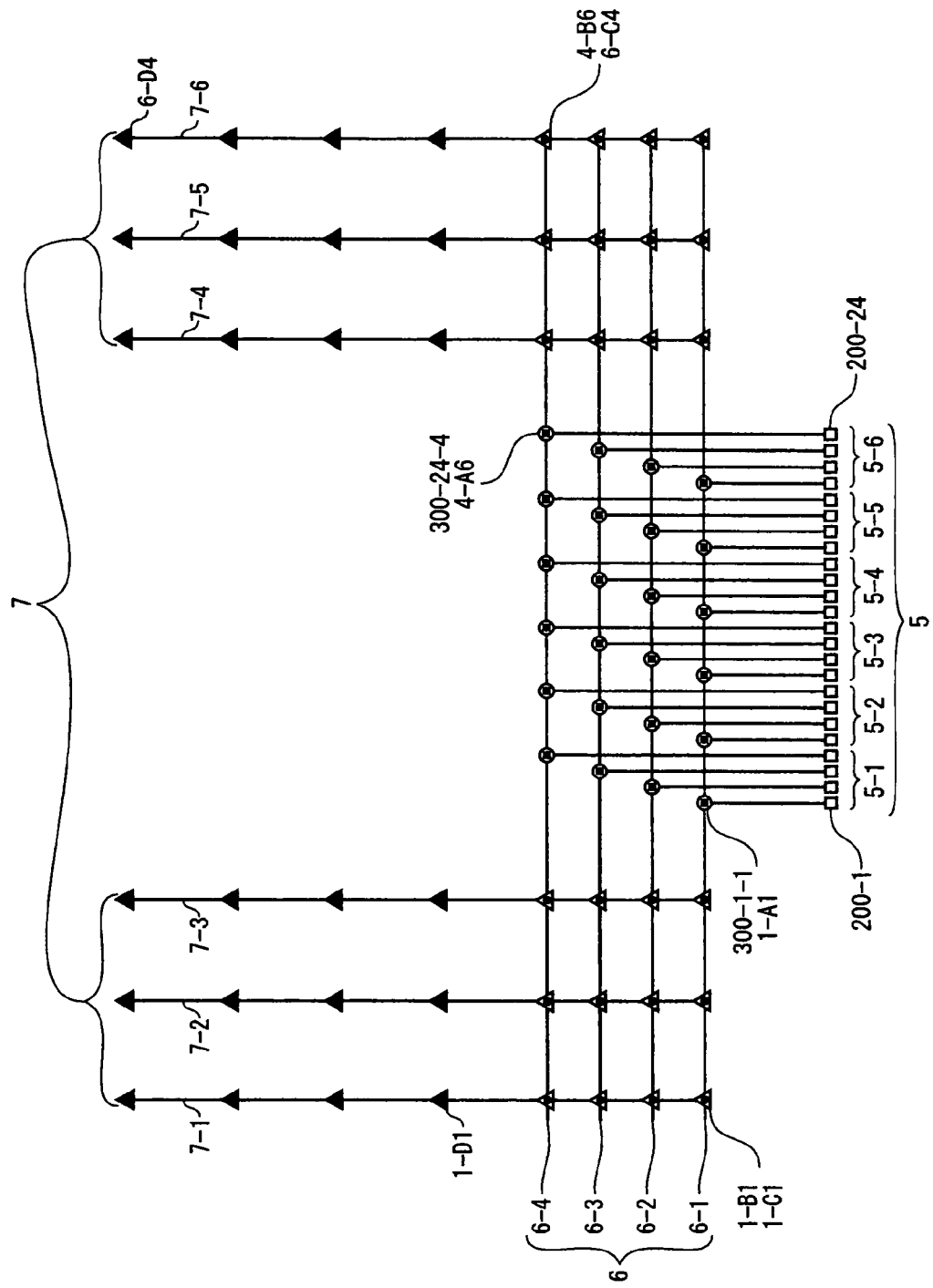
FIG. 10 is a schematic plan showing the connection of all the terminals from probe input terminals 200-$i$ of contactors to x-directional wiring output terminals S-Do.
Figure 11:
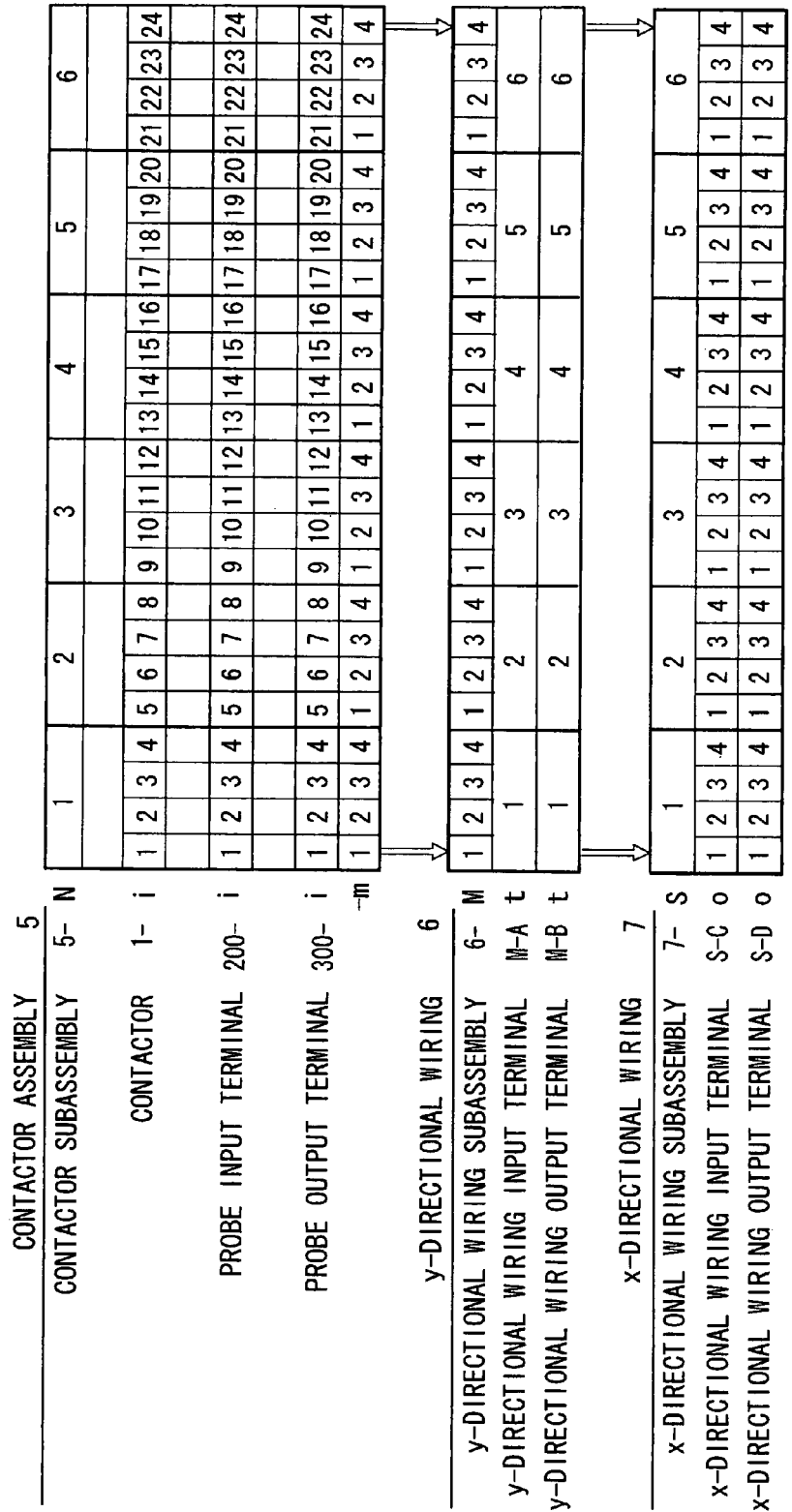
FIG. 11 is a terminal connection table.

FIG. 10 is a schematic plan showing the connection of all the terminals from probe input terminals 200-$i$ of contactors to x-directional wiring output terminals S-Do. It shows, for instance, a connection sequence from the contactor subassembly 5-6 (N=6) to the contactor 1-26 (i=24) to the y-directional wiring subassembly 6-4 (M=4) to the y-directional wiring input terminal 4-A6 (t=6) to the y-direction output terminal 4-B6 (t=6) to the x-directional output terminal 6-D4 (o=4). FIG. 11 is a terminal connection table. FIG. 11, tabulating the connected state of all the terminals in Embodiment 1, shows that the relationship described with reference to FIG. 10 is a vertical connective relationship indicated by arrows at the right end of the table.

Embodiment 2

Embodiment 2 of the present invention will be described in detail below with reference to FIGS. 12 and 13. Embodiment 2 is a version of Embodiment 1 having a structure which allows the wiring of the input terminals and the output terminals of the y-directional wiring and the wiring of the input terminal and the output terminal of the x-directional wiring to be freely selected at the design stage. This selectability enables wiring, in whatever sequence the probe input terminals 200-$i$ may be arrayed, to be arranged in desired positions of the x-directional transformation wiring output terminals.

A case will be described in which the sequence from the y-directional transformation wiring input terminals to the y-directional transformation wiring output terminals is changed in the following way in Embodiment 1 and Embodiment 2.

In Embodiment 1:

A1→B1, A2→B2, A3→B3, A4→B4, A5→B5, A6→B6

In Embodiment 2:

A1→B1, A2→B2, A3→B5, A4→B6, A5→B4, A6→B3

In Embodiment 1, when wiring is attempted from a y-directional transformation wiring input terminal in the central part to a y-directional transformation wiring output terminal in an outer part, interference between wires may occur.

Figure 12:
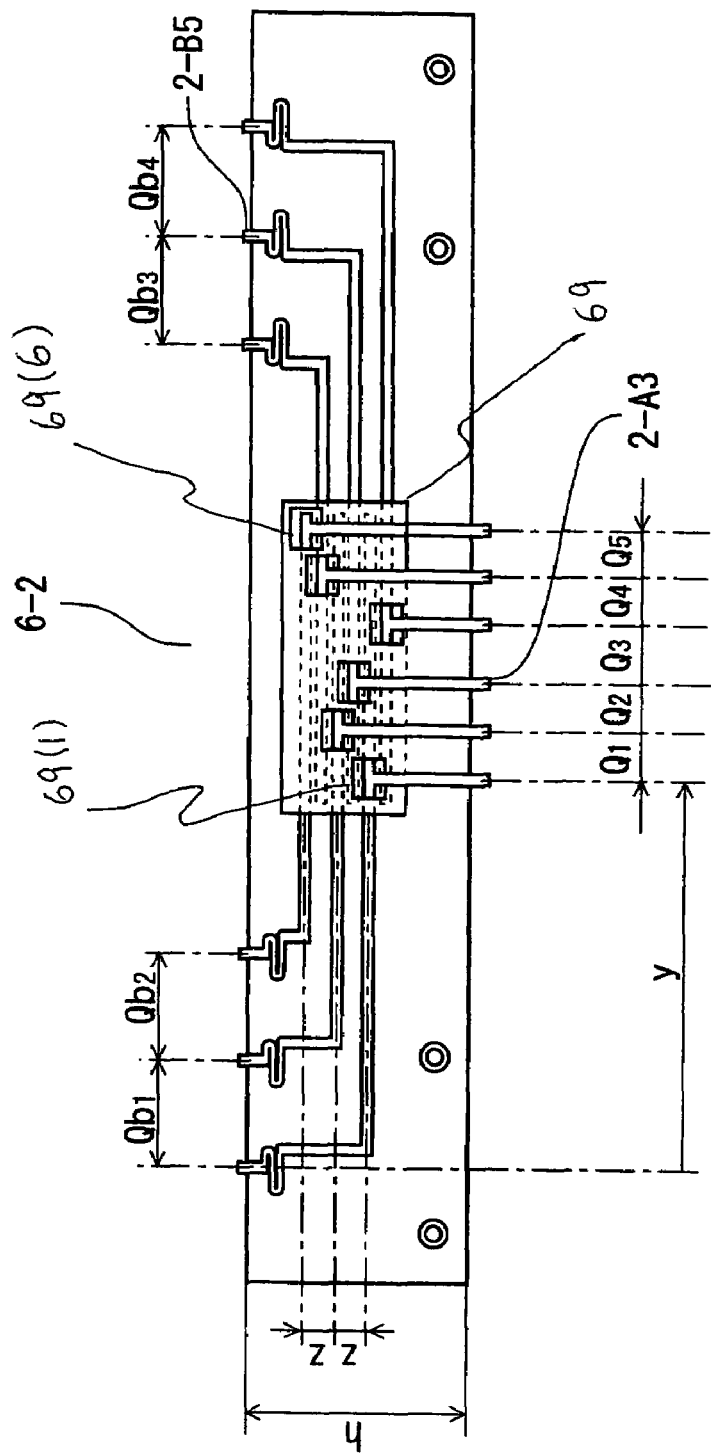
FIG. 12 shows the structure of y-directional wiring in Embodiment 2 of the invention.

FIG. 12 shows y-directional wiring in Embodiment 2 of the invention. Referring to FIG. 12, in order to avoid the kind of interference referred to above, the y-directional transformation wiring ft is provided with an insulating film 69, windows 69(1), 69(2), . . . 69(6) are formed in the insulating film 69, and y-directional transformation wiring input terminals are made connectable to y-directional transformation wiring output terminals through these windows.

| | Windows | | | | |
|---|---|---|---|---|---|
| 69(1) | 69(2) | 69(3) | 69(4) | 69(5) | 69(6) |

| y-directional transformation wiring output terminals | | | | | |
|---|---|---|---|---|---|
| 2-B1 | 2-B2 | 2-B5 | 2-B6 | 2-B4 | 2-B3 |

| y-directional transformation wiring input terminals | | | | | |
|---|---|---|---|---|---|
| 2-A1 | 2-A2 | 2-A3 | 2-A4 | 2-A5 | 2-A6 |

Figure 13:
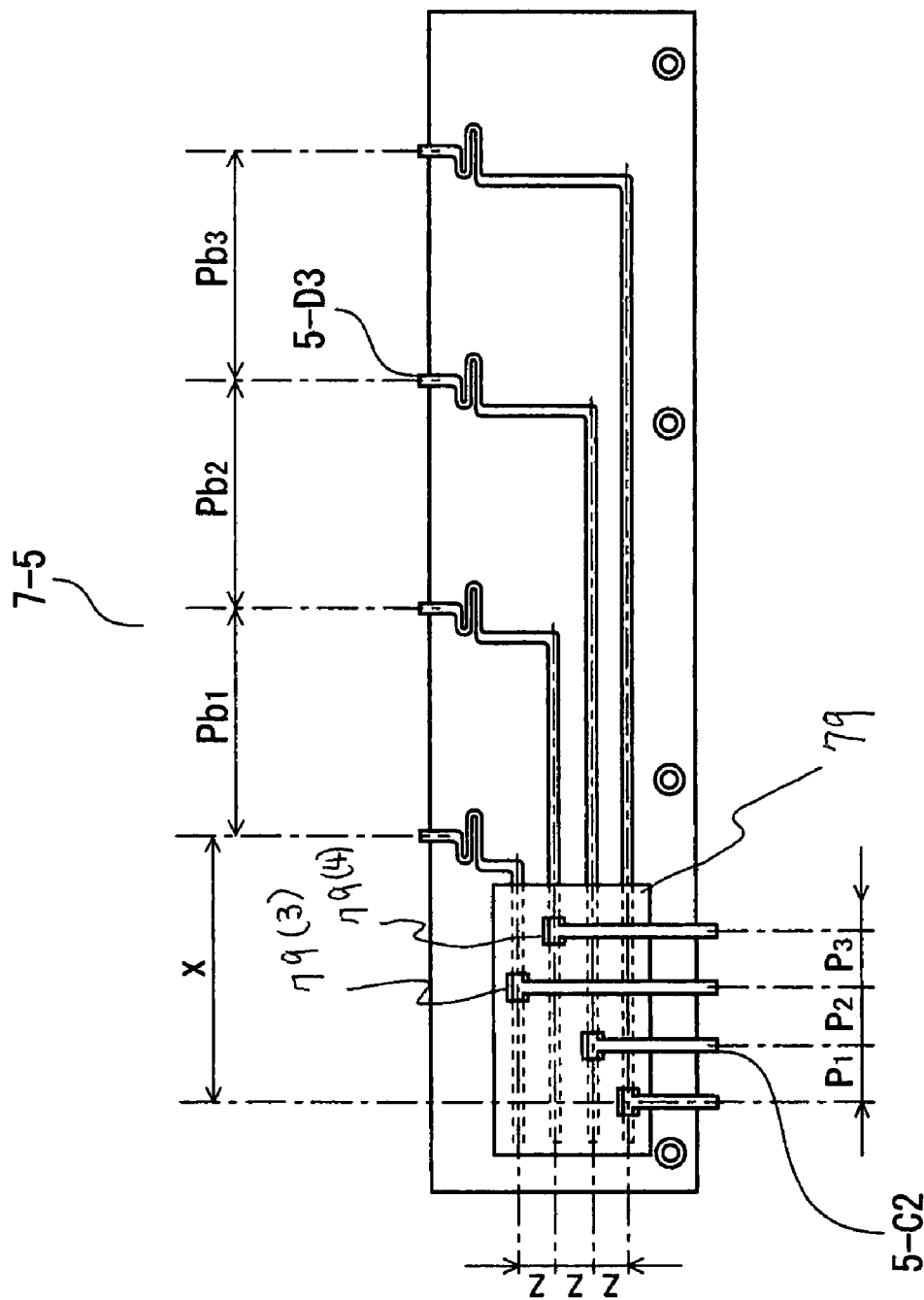
FIG. 13 shows the structure of x-directional wiring in Embodiment 2 of the invention.
Figure 14:
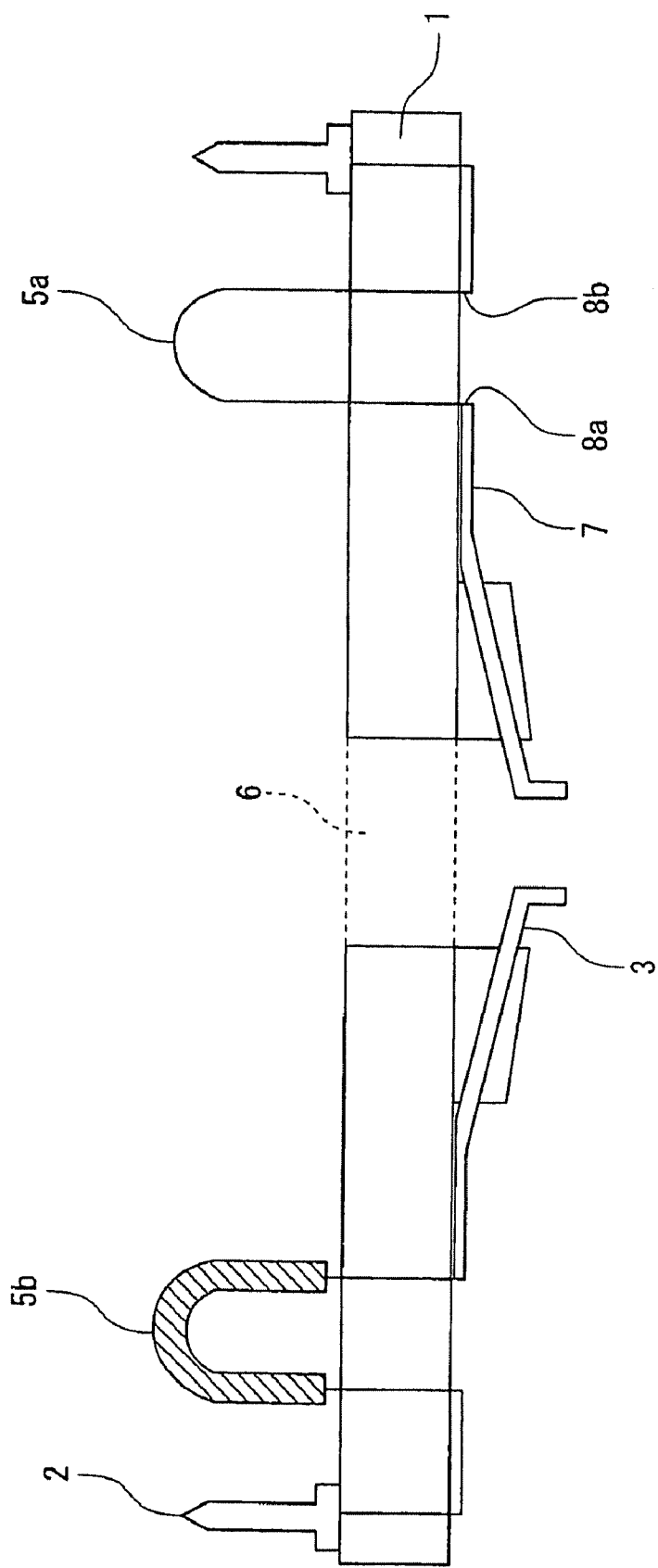
FIG. 14 shows a conventional example of probe card.

FIG. 13 shows x-directional wiring in Embodiment 2 of the invention.

| Windows | | | |
|---|---|---|---|
| 79(1) | 79(2) | 79(3) | 79(4) |

| x-directional transformation wiring input terminals | | | |
|---|---|---|---|
| 5-C1 | 5-C2 | 5-C3 | 5-C4 |

| x-directional transformation wiring output terminals | | | |
|---|---|---|---|
| 5-D4 | 5-D3 | 5-D1 | 5-D2 |

Referring to FIG. 12, the y-directional transformation wiring input terminal 2-A3 of the y-directional wiring 6-M (M=2) is connected to the y-directional transformation wiring output terminal 2-B5.

Avoidance of continuity to a wiring unit to which connection should be made is achieved through the insulating film in this way and achieving required connection to the y-directional transformation wiring ft can be readily accomplished by etching or screen printing.

Similarly, the x-directional wiring shown in FIG. 13 allows connection to establish selective continuity from S-Co to S-Do through windows 79(1) to 79(4).

As hitherto described, the transformation wiring according to the invention enables vertical contactors regularly arrayed over a film to come into vertical contact with the end faces of wiring terminals formed at one end of a flexible flat cable. It provides an advantage of allowing electrical connection of signals on a narrow-pitch line array over an inexpensive printed wiring board having sparse electrodes without involving the intervention of multi-layered substrate technology, and contributes to the development of technology for connecting signal lines from a narrowed-pitch contactor array to a printed circuit board. It further has an advantage of dispensing with soldering of wiring.

Although the invention has been described with reference to exemplary embodiments thereof illustrated in accompanying drawings, it is obvious to persons skilled in the art that the invention can be readily altered or modified without deviating from the underlying principles. The invention also covers such alterations and modifications.

What is claimed is:

1. A coordinate transforming apparatus for electrical signal connection comprising:
    a probe that has probe input terminals and probe output terminals arrayed in narrow-pitch lines which come into contact with and establish continuity to a wafer pad and in which the probe output terminals are arrayed two-dimensionally in a wide pitch over a substantial plane; a y-directional wiring group in which the probe output terminals and a plurality of transformation wiring input terminals cross each other to come into contact with and establish continuity among each other; and an x-directional wiring group that crosses and establishes continuity to the output terminals of the y-directional wiring group;
    wherein each individual wiring unit of the x-directional wiring group and the y-directional wiring group is formed over a resin film, and x-directional wiring group input terminals, x-directional wiring group output terminals, y-directional wiring group input terminals and y-directional wiring group output terminals protrude from the outer circumferences of the resin films.

2. The coordinate transforming apparatus according to claim 1, wherein:
    the probe is connected to a surface of a resin film and the probe and the resin film constitute a contactor; and
    when a plurality of contactors are stacked in a direction normal to the respective surfaces of the resin films, the probe output terminal sections of the respective contactors define a sparse two-dimensional array in which the probe terminal sections are lagged in substantially equal pitches between one contactor and another contactor adjacent thereto.

3. The coordinate transforming apparatus according to claim 1, wherein a plurality of probe output terminals are arranged on a straight line and connected to a plurality of y-directional wiring units formed over a single resin film.

4. The coordinate transforming apparatus according to claim 1, wherein the output terminals of the y-directional wiring group are arranged on a straight line and connected to a plurality of x-directional wiring units formed over a resin film.

5. The coordinate transforming apparatus according to claim 1, wherein an output destination of signals is selectable by construction of the x-direction wiring group and the y-direction wiring group with an insulating film in-between.

6. A coordinate transforming apparatus for electrical signal connection comprising:
    a probe that has probe input terminals and probe output terminals arrayed in narrow-pitch lines which come into contact with and establish continuity to a wafer pad and in which the probe output terminals are arrayed two-dimensionally in a wide pitch over a substantial plane; a y-directional wiring group in which the probe output terminals and a plurality of transformation wiring input terminals cross each other to come into contact with and establish continuity among each other; and an x-directional wiring group that crosses and establishes continuity to the output terminals of the y-directional wiring group;
    wherein the output terminals of the y-directional wiring group are arranged on a straight line and connected to a plurality of x-directional wiring units formed over a resin film.

7. The coordinate transforming apparatus according to claim 6, wherein:

the probe is connected to a surface of a resin film and the probe and the resin film constitute a contactor; and when a plurality of contactors are stacked in a plane perpendicular to the surface of the resin film, the probe output terminal sections of the respective contactors define a sparse two-dimensional array in which the probe terminal sections are lagged in substantially equal pitches in a longitudinal direction of the probe between one contactor and another contactor adjacent thereto.

8. The coordinate transforming apparatus according to claim 6, wherein a plurality of probe output terminals are arranged on a straight line and connected to a plurality of y-directional wiring units formed over a single resin film.

9. The coordinate transforming apparatus according to claim 6, wherein an output destination of signals is selectable by construction of the x-direction wiring group and the y-direction wiring group with an insulating film in-between.

* * * * *